United States Patent [19]
Romero et al.

[11] Patent Number: 5,480,727
[45] Date of Patent: Jan. 2, 1996

[54] ELECTRONIC DEVICE ASSEMBLY AND METHOD FOR MAKING

[75] Inventors: Guillermo L. Romero, Phoenix; Brent W. Pinder, Tempe, both of Ariz.

[73] Assignee: Motorola, Inc., Schaumburg, Ill.

[21] Appl. No.: 190,974

[22] Filed: Feb. 3, 1994

[51] Int. Cl.⁶ .................................................. H02J 1/00
[52] U.S. Cl. ................ 428/539.5; 428/545; 257/703; 257/709; 164/97
[58] Field of Search .................................. 257/703, 709; 428/539.5, 545; 164/97

[56] References Cited

U.S. PATENT DOCUMENTS

| | | | |
|---|---|---|---|
| 4,408,256 | 10/1983 | Val | 361/403 |
| 4,788,626 | 11/1988 | Neidig et al. | 361/386 |
| 4,859,640 | 8/1989 | Newkirk | 501/128 |
| 4,960,736 | 10/1990 | Luxzcz et al. | 501/127 |
| 5,007,475 | 4/1991 | Kennedy et al. | 164/97 |
| 5,020,583 | 6/1991 | Aghjanian et al. | 164/97 |
| 5,105,536 | 4/1992 | Neugebauer et al. | 29/832 |
| 5,163,499 | 11/1992 | Newkirk et al. | 164/98 |
| 5,188,985 | 2/1993 | Medeiros, III et al. | 437/218 |
| 5,216,279 | 6/1993 | Nakao | 257/712 |
| 5,221,558 | 6/1993 | Sonuparlak et al. | 427/376.1 |
| 5,222,542 | 6/1993 | Burke | 164/97 |
| 5,313,098 | 5/1994 | Trumpey et al. | 257/712 |
| 5,347,426 | 9/1994 | Dermarkar et al. | 361/708 |

*Primary Examiner*—Donald P. Walsh
*Assistant Examiner*—Scott T. Bluni
*Attorney, Agent, or Firm*—Aaron B. Bernstein

[57] ABSTRACT

A single, integral Metal Matrix Composite structure (47) includes a base plate (11), circuit layer (25), and lead supports (30,32), forming the single integral structure (47). Such a structure is particularly suited for power module applications. The various elements are well matched, thermally. Additionally, the structure (47) can be fabricated using straightforward molding processes, rather than complicated, fixtured, bonding and solder processes which are typically used for conventional power modules.

8 Claims, 2 Drawing Sheets

． ． ．

ELECTRONIC DEVICE ASSEMBLY AND METHOD FOR MAKING

FIELD OF THE INVENTION

The present invention relates, in general, to power modules, and more particularly to power modules including metal matrix composite structures.

BACKGROUND OF THE INVENTION

Power semiconductor devices are generally used in applications which require the manipulation of high levels of current. These well known applications include electric motors for industrial use, such as heating, cooling, and ventilation systems, electric vehicles, switch mode power supplies, and power factor correction applications. The current that must be handled by each power module can be as high as 1200 Amps. This necessitates the use of heavy power leads to route current in and out of the power module. The leads are generally attached to a metal circuit pattern with solder paste, which is reflowed in a belt furnace or on a hot plate.

There are several inherent problems with this type of lead design and construction. By design, the solder joint between the heavy copper power lead and the thinner metallized circuit pattern is not a reliable joint. Solder fatigues very easily and any stresses applied to the power lead after it is attached quickly create cracks in the joint and can cause failures. The heavy bus bars to which power modules are mounted can create a large twisting moment on the power leads. If the stresses are not properly relieved, the stresses are transferred to the solder joint and will contribute to crack propagations during thermal cycling. Another problem with this type of power lead is assembly. These leads are generally difficult to manipulate in volume production and often require complicated fixturing to keep them in place while the solder paste reflows. Variations in tolerances in the leads or fixtures complicate the assembly further and often result in a less than ideal joint.

DETAILED DESCRIPTION OF THE DRAWINGS

This invention involves the design of molded power leads formed integrally with the baseplate of a power module, but kept electrically isolated from the mounting surface. Functionally, these leads behave the same as standard leads, but are designed and constructed using metal matrix composite (MMC) technology. This technology entails the use of molded ceramic preforms (such as Silicon Carbide) infiltrated with a reinforcing metal (such as aluminum or aluminum alloy) to form the base of a module, as well as power leads. Additionally, the isolation layer containing the circuitry is also bonded to the base and leads during the infiltration step. In the present embodiment, the power module base, electrical isolation, and power leads are integrally formed into one piece part using a Silicon Carbide-Aluminum metal matrix composite. There are other MMC's that can also be used.

Figure 1:
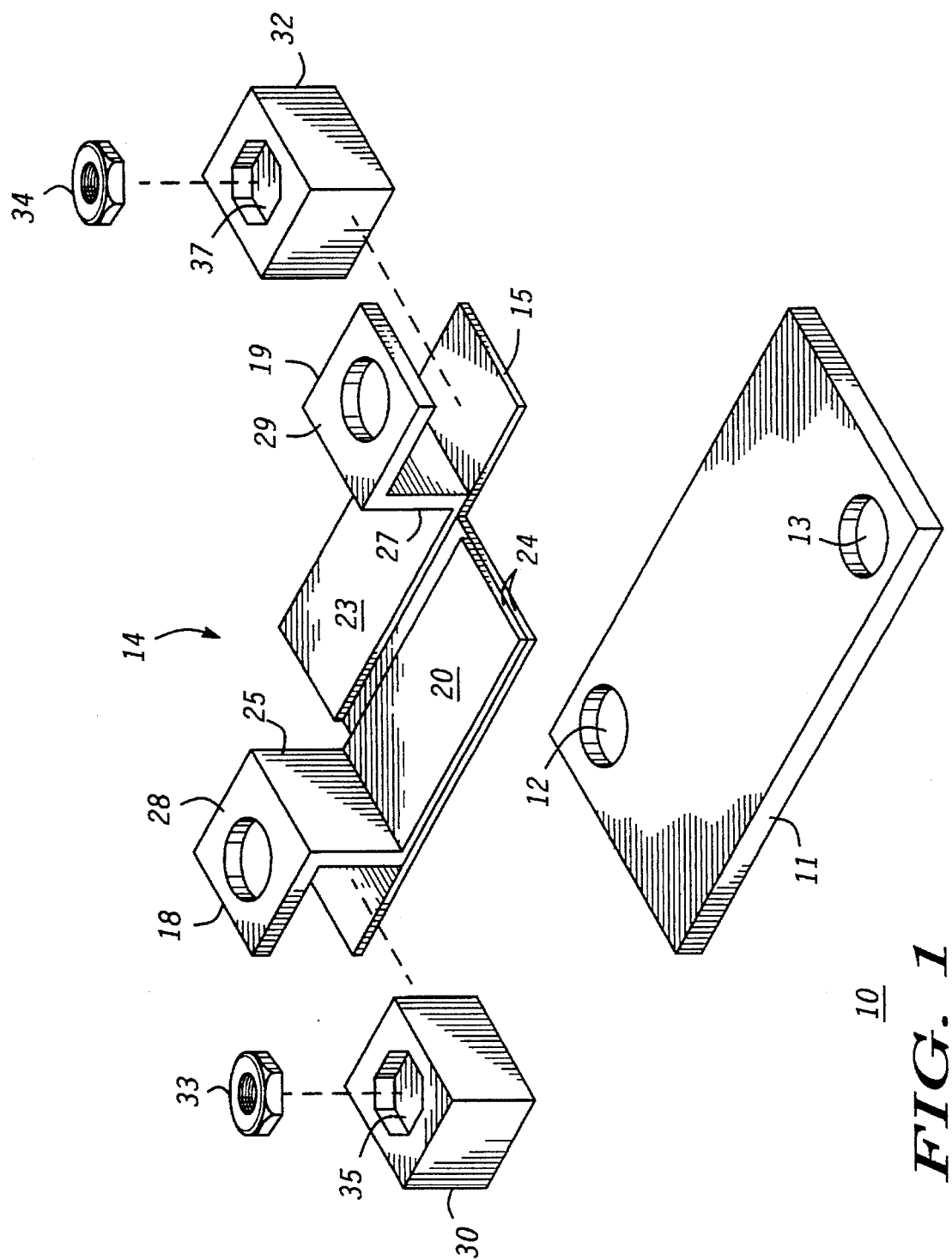
FIG. 1 is an exploded perspective view of components comprising a power module.

FIG. 1 is an exploded perspective view of components of a power module 10 (only certain components of module 10 are shown) made with one particular method in accordance with the present invention. The power module 10 includes flat base plate 11. Flat base plate 11 is composed of molded metal matrix composite material which has not yet been infiltrated. Flat base plate 11 essentially forms the bottom of the power module 10. In the embodiment illustrated, flat base plate 11 includes mounting holes 12 and 13. Mounting holes 12 and 13 provide convenient holes for fastening power module 10 to a flat surface in its working environment.

Power module 10 further includes an arrangement 14 of ceramic isolation layer 15, and power leads 18 and 19. The electrically insulating layer 15 typically comprises a ceramic layer made of aluminum nitride or a material with similar insulating characteristics. The power leads 18 and 19 typically comprise 0.2–0.5 mm copper bonded to the aluminum nitride or other ceramic using a direct bonded copper attachment. As is well known in the art, direct bonded copper includes a thin layer of copper on one or two surfaces of a ceramic layer attached at roughly 1065° C. In the present case the copper, which comprises power leads 18 and 19, is attached to the top surface of insulating layer 15.

Tail portions 20 and 23 of power leads 18 and 19, respectively, together with underlying insulating layer 15, provide a circuit layer 24. Circuit layer 24 provides the substrate for attaching a solid state circuit (illustrated in FIG. 2).

Power leads 18 and 19 are preformed extending power leads. Leads 18 and 19 are considered preformed because they each comprise perpendicular portions 25 and 27, which extend perpendicular to circuit layer 24, as well as parallel portions 28 and 29, which extend parallel to circuit 24.

As will be discussed later in more detail, arrangement 14 is situated on top of flat base plate 11 in order to construct power module 10.

Power module 10 further comprises lead supports 30 and 32. Lead supports 30 and 32 comprise uninfiltrated metal matrix composite material, preferably the same material as base plate 11. Lead supports 30 and 32 are intended to be positioned between parallel portions 28 and 29, respectively, of extending power leads 18 and 19, an insulating layer 15. Lead supports 30 and 32 provide physical support and integrity to preformed extending power leads 18 and 19.

Lead supports 30 and 32 comprise regions 35 and 37 which are shaped to receive nuts 33 and 34, respectively. During assembly, nuts 33 and 34 are placed in regions 35 and 37, respectively, before lead supports 30 and 32 are inserted beneath leads 18 and 19, respectively. Nuts 33 and 34 can then receive fasteners, such as bolts, screws, etc., passing through preformed leads 18 and 19, so as to provide easy attaching of external electrical contacts.

At this point in the construction of the MMC power module, base plate 11 and lead supports 30 and 32 are ready for infiltration. These three Silicon Carbide components, together with substrate arrangement 14, which includes insulating layer 15 and power leads 18 and 19, are placed in a mold cavity. A molten aluminum alloy is then infiltrated, using standard injection molding equipment and technology, into the porosity of the silicon carbide at relatively high controlled temperature.

This process accomplishes several things simultaneously. The aluminum alloy reinforces the fragile silicon carbide preform, forming a robust lightweight baseplate 11 and strong lead supports 30 and 32. More importantly, however, this infiltration process unites all the components in the mold cavity into a single piece part. The bonds among the insulating ceramic layer 15, the MMC baseplate 11, and power lead supports 30 and 32 are both mechanical and atomic, providing for good thermal transfer. Also the coefficients of thermal expansion between the insulating layer 15 and the newly formed MMC baseplate 11 are both close to 6.5 ppm/° C., ensuring good reliability during thermal cycling. Additionally, power leads 18 and 19 are also bonded to the power lead supports, though this bond is not as critical.

Figure 2:
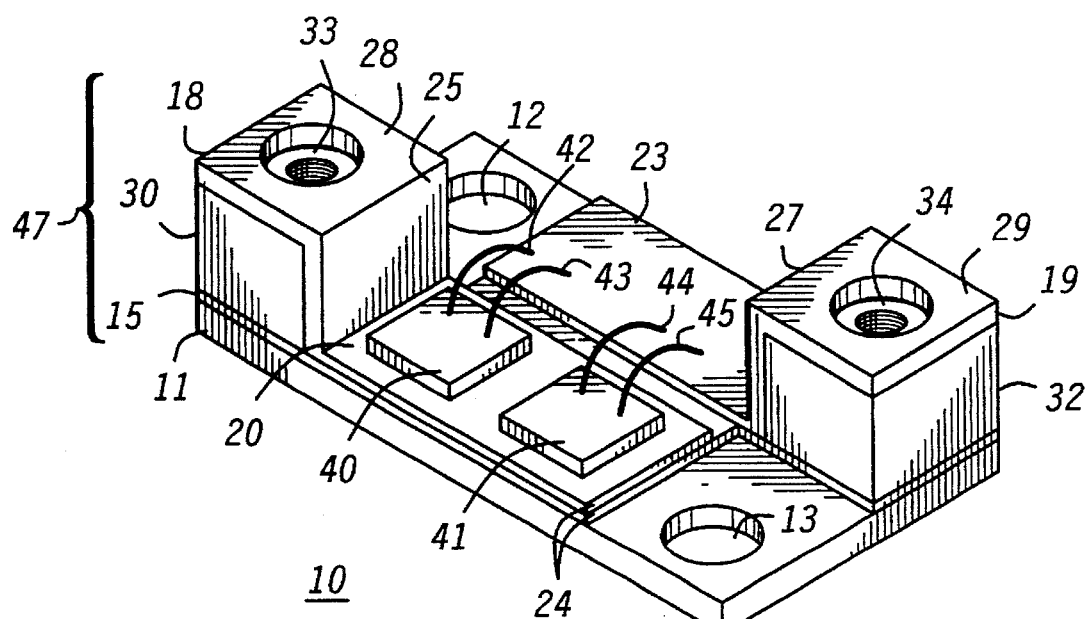
FIG. 2 is a perspective view of a partially assembled power module, including an electronic circuit.

FIG. 2 is a perspective view illustrating power module 10, further along in the assembly process compared to FIG. 1. The components of power module 10 illustrated in FIG. 1 have been assembled and infiltrated, as described above. Additionally, FIG. 2 illustrates electronic components 40 and 41 situated on circuit layer 24. Electronic components 40 and 41 are attached to tail portion 20 of preformed extending power lead 18 with conventionally known methods. Electronic components 40 and 41 are additionally shown wire bonded, via wire bonds 42, 43 and 44, 45, respectively, to tail portion 23 of preformed extending lead 19. Wire bonding is accomplished with conventional methods. In the depicted embodiment, the module shown is a simple rectifier circuit. Electronic components 40 and 41 may be ultrafast planar diodes, well known to those in the industry. The bottom of the diodes is the cathode junction, and is connected to power lead 18 via a solder attachment. The top portion of the diodes is the anode junction and is connected via the wirebonds to power lead 19. Many other rectifier circuits can be built this way, as well as virtually any other type of power module.

The assembly shown in FIG. 2, without electronic components 40, 41 and associated wires, is considered a metal matrix composite structure 47. Structure 47 is therefore a single, integral structure because the infiltration process described in detail above causes circuit layer 24, as well as lead supports 30 and 32, to be captured integrally as part of a single metal matrix composite structure.

The primary advantages of this structure are related to increased reliability and simplified assembly. Since the power leads are formed integrally with the rest of the baseplate and ceramic isolation, the unreliable solder joint normally used to bond power leads is eliminated and so are the associated solder fatigue failure modes. Additionally, insulating ceramic layer 15, baseplate 11, and lead supports 30 and 32 are all closely matched in terms of thermal expansion, providing for excellent reliability. The other significant advantage is the simplified module assembly. Since the power leads are incorporated into the manufacture of the integrated baseplate, the actual assembly steps required to complete the module consist simply of die attach, wire bond attach, and encapsulation. A simplified process translates to higher yields and overall cost savings.

Figure 3:
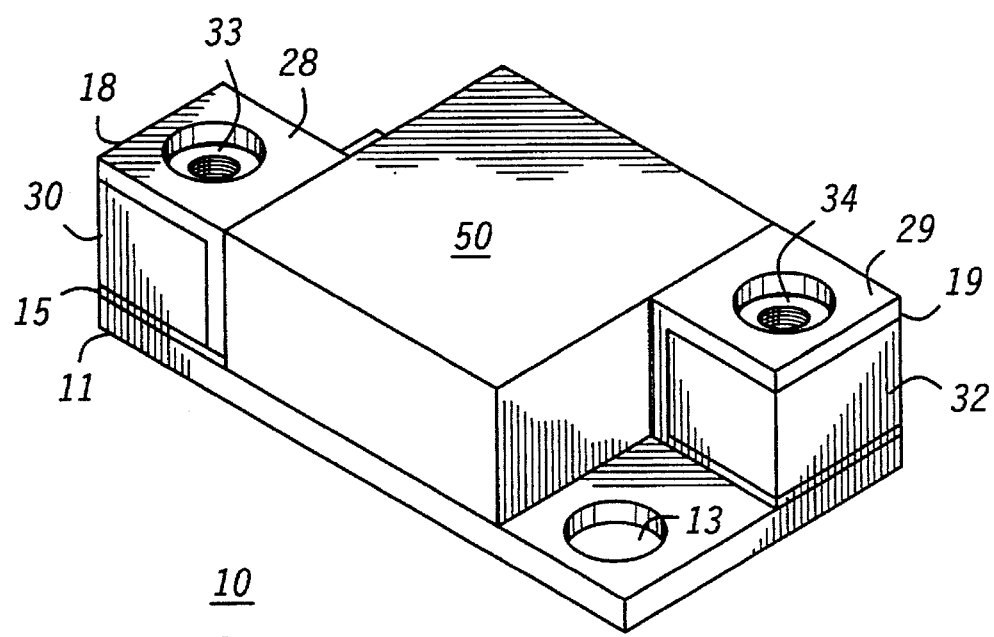
FIG. 3 is a perspective view of a power module, including circuit encapsulation.

FIG. 3 illustrates power module 10 in substantially complete form. Encapsulating material 50 has been added, encapsulating the electronic components 40 and 41, and associated leads and wires. Encapsulating material 50 protects the circuitry from the environment, etc., as is well known in the industry. Encapsulating material 50 may comprise typical molding compounds. Furthermore, the molding processes used are conventional and well known in the art.

By now it should be appreciated that an improved power module has been discussed which provides a fully integrated power module base plate, including the features of electrical isolation, molded power leads, and thermally matched materials. This unitary structure further provides for improved reliability and reduced assembly steps and costs.

While a specific illustrative embodiment has been shown and described, further modifications and improvements will occur to those skilled in the art. Consequently, it should be understood that the present invention is not limited to the particular embodiment shown. Rather, the appended claims are intended to cover all modifications that do not depart from the spirit and scope of this invention.

We claim:

1. A power module comprising:

a circuit layer comprising an insulating layer under a power lead; and a lead support situated between the power lead and the insulating layer, the lead support shaped to capture a nut, wherein the circuit layer and the lead support are infiltrated to form a metal matrix composite structure.

2. The power module of claim 1, wherein the metal matrix composite structure comprises a flat base.

3. The power module of claim 1, wherein the power lead has a thickness in the range of 30–50 mils.

4. The power module of claim 1, further comprising an electronic circuit situated on the circuit layer.

5. The power module of claim 4, further including encapsulation material encapsulating the electronic circuit and a portion of the circuit layer.

6. The power module of claim 1, wherein the power lead has a perpendicular portion extending perpendicularly to the circuit layer and a parallel portion extending parallel to the circuit layer.

7. A power module comprising:

a circuit layer having a power lead;

a lead support in contact with the power lead, the lead support shaped to capture a nut; and wherein the circuit layer and the lead support are captured integrally via infiltration to a metal matrix composite structure.

8. The power module of claim 7, wherein the power lead comprises a perpendicular portion extending perpendicularly from the circuit layer and a parallel portion extending parallel to the circuit layer.

\* \* \* \* \*